United States Patent [19]
Maniar et al.

[11] Patent Number: 5,525,542
[45] Date of Patent: Jun. 11, 1996

[54] METHOD FOR MAKING A SEMICONDUCTOR DEVICE HAVING ANTI-REFLECTIVE COATING

[75] Inventors: Papu D. Maniar; Robert W. Fiordalice; Kevin G. Kemp; Bernard J. Roman, all of Austin, Tex.

[73] Assignee: Motorola, Inc., Schaumburg, Ill.

[21] Appl. No.: 393,781

[22] Filed: Feb. 24, 1995

[51] Int. Cl.$^6$ .................................... H01L 21/28
[52] U.S. Cl. .................... 437/186; 437/187; 437/192; 437/193; 437/194; 148/DIG. 113
[58] Field of Search ..................... 437/187, 192, 437/193, 194, 19 S, 186, 406 S, 416 S; 148/DIG. 113

[56] References Cited

U.S. PATENT DOCUMENTS

| | | | |
|---|---|---|---|
| 3,869,322 | 3/1975 | Cuomo et al. | 437/133 |
| 4,183,040 | 1/1980 | Rideout | 437/187 |
| 4,288,256 | 9/1981 | Ning et al. | 437/195 |
| 4,540,914 | 9/1985 | Maple | 313/466 |
| 4,820,611 | 4/1989 | Arnold, III et al. | 430/271 |
| 5,270,263 | 12/1993 | Kim et al. | 437/236 |

FOREIGN PATENT DOCUMENTS

| | | |
|---|---|---|
| 01223750 | 9/1989 | Japan . |
| 1-241125 | 9/1989 | Japan . |

OTHER PUBLICATIONS

S. Wolf, "Silicon Processing for the VLSIEr, vol. 1", Lattice Press, (1986), p. 427.

J. Givens, et al.; "Selective dry etching in a high density plasma for 0.5 μm complementary metal–oxide–semiconductor tech.;" J. Vac. Sci. Technol. B, vol. 12, No. 1, pp. 427–432 (Jan./Feb. 1994).

C. Yu, et al.; "Deposition, Characterization, and Application of Aluminum Nitride Thin Films for Microelectronics;" Mat. Res. Soc. Symp. Proc., vol. 264, pp. 401–405 (1992).

S. Bhat, et al.; "Reactive Ion Beam Deposition of Aluminum Nitride Thin Films;" Journal of Elect. Materials, vol. 14, No. 4, pp. 405–418 (1985).

R. K. Sadhir, et al.; "Preparation of Aluminum Nitride Thin Films for use in Microelectronics," IEEE; Ch. 2452-1, pp. 17–21 (1987).

R. G. Gordon, et al.; "Chemical vapor deposition of aluminum nitride thin films;" J. Mater. Res, vol. 7, No. 7, pp. 1679–1684 (1992).

S. J. Pearton, et al.; "Dry and wet etching characteristics of InN, AIN, and GaN deposited by electron cyclotron . . . ;" J. Vac. Sci. Technol. A, vol. 11, No. 4, pp. 1772–1775 (1993).

P. B. Legrand, et al,; "Optical properties of sputter–deposited aluminium nitride films on silicon;" SSDI, pp. 220–223 (1994).

*Primary Examiner*—George Fourson
*Assistant Examiner*—Thomas G. Bilodeau
*Attorney, Agent, or Firm*—Patricia S. Goddard

[57] ABSTRACT

An anti-reflective coating (ARC) (20) is formed over a reflective, conductive layer (18), such as polysilicon or aluminum, in a semiconductor device (10). The ARC is an aluminum nitride layer. During photolithography, the ARC absorbs radiation waves (30), particularly absorbing wavelengths under 300 nanometers, such as deep ultraviolet (DUV) radiation at 248 nanometers. Being absorbed by the ARC, the radiation waves are prevented from reflecting off the underlying conductive layer. Thus, resist mask (34) is patterned and developed true to the pattern on lithography mask (24), resulting in accurate replication into appropriate layers of the device.

17 Claims, 3 Drawing Sheets

5,525,542

METHOD FOR MAKING A SEMICONDUCTOR DEVICE HAVING ANTI-REFLECTIVE COATING

CROSS-REFERENCE TO RELATED APPLICATIONS

Material related to the subject matter of the present invention is disclosed in the following co-pending, commonly assigned patent applications:

1) Ser. No. 08/309,231, filed Sep. 20, 1994, by Roman et al., entitled, "Method and Structure for Forming an Integrated Circuit Pattern on a Semiconductor Device;"
2) Ser. No. 08/393,783, filed concurrently herewith, by Maniar et al., entitled, "Method for Providing Trench Isolation and Semiconductor Device Having the Same;"
3) Ser. No. 08/393,782, filed concurrently herewith, by Fiordalice et al., entitled, "Method for Forming a Plug and Semiconductor Device Having the Same."

FIELD OF THE INVENTION

The present invention relates to semiconductor devices in general, and more particularly to semiconductor devices having anti-reflective coatings to aid in pattern formation and methods for making the same.

BACKGROUND OF THE INVENTION

The semiconductor industry's continuing drive toward integrated circuits with ever decreasing geometries, coupled with its pervasive use of highly reflective materials, such as polysilicon, aluminum, and metal silicides, has led to increased photolithographic patterning problems. Unwanted reflections from these underlying materials during the photoresist patterning process often cause the resulting photoresist patterns to be distorted. This problem is further compounded when photolithographic imaging tools utilizing deep ultraviolet (DUV) exposure wavelengths (approximately 248 nanometers (nm)) are used to generate the photoresist patterns. Although shorter imaging wavelengths bring improved resolution by minimizing diffraction limitations, the resulting patterns generated in the photoresist are easily compromised by the effects of uncontrolled reflections from underlying materials due to the increased optical metallic nature of underlying reflective materials at these shorter wavelengths. Moreover, photoresist patterns are particularly degraded in areas where the topology of the underlying reflective material changes. In stepped areas of semiconductor devices, reflection intensity from underlying materials is often enhanced and results in "reflective notching" or a locally distorted photoresist pattern near the stepped areas. Therefore, the formation of submicron photoresist patterns over semiconductor substrates using DUV lithography is difficult to achieve, and as a result, fabrication of advanced integrated circuits with submicron geometries is limited. Moreover, many known anti-reflective coating materials used in semiconductor manufacturing are not suitable for use with DUV lithography. For example, titanium nitride is increasingly metallic as exposure wavelength is reduced to the DUV range of 248 nm, meaning titanium nitride has high reflectivity for DUV radiation and is not an effective anti-reflective coating for DUV. While silicon-rich silicon nitride has been suggested for use as an anti-reflective coating with DUV, it cannot be used on aluminum because process temperatures for forming the silicon-rich silicon nitride are too high for back-end processing.

Accordingly, a need exists for a method that forms submicron integrated circuit patterns in a photoresist layer which overlies the varying topography and highly reflective materials found on semiconductor substrates. Particularly useful would be a method which compliments the use of DUV lithography.

DETAILED DESCRIPTION OF THE PREFERRED EMBODIMENT

Figure 1:
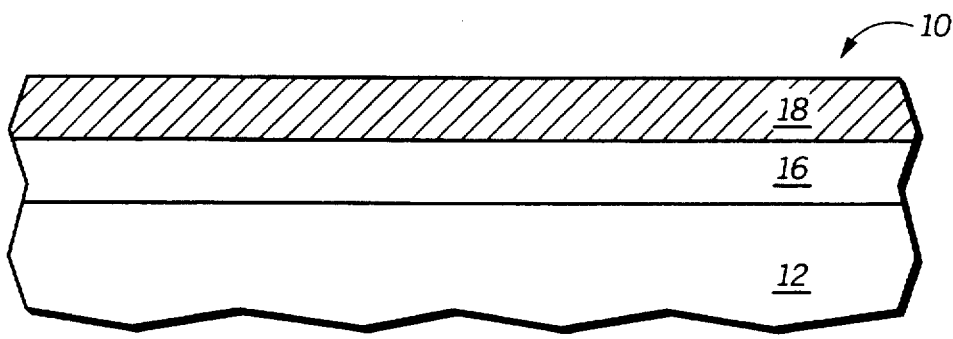
FIGS. 1–5 illustrate, in cross-section, a portion of a semiconductor device as the device undergoes sequential process steps for patterning a conductive layer using an anti-reflective coating in accordance with an embodiment of the present invention.

Generally, the present invention relates to using an aluminum nitride layer over a reflective layer (such as a conductive layer) in a semiconductor device to prevent unwanted radiation reflection during photolithography operations which use DUV radiation. DUV radiation in semiconductor manufacturing refers to shorter radiation wavelengths, for example wavelengths of 248 nanometers, as compared to G-line (436 nanometers), H-line (405 nanometers), or I-line (365 nanometers) lithography. Aluminum nitride has moderate to high absorptance (low transmittance and low reflectance) of radiation in the DUV range of the spectrum, whether deposited by sputtering, chemical vapor deposition, or reactive ion beam deposition. When used on or over conductive layers of a semiconductor wafer, such as aluminum or polysilicon layers, the aluminum nitride absorbs radiation so that radiation is not transmitted through to the conductive layer, thereby eliminating reflectance of the radiation by the conductive layer. A further advantage of using aluminum nitride as an anti-reflection coating (ARC) is that aluminum nitride can also serve as an etch stop layer during subsequent via etches. Etch selectivity between aluminum nitride and silicon-based oxides is good since the etch rate of aluminum nitride in fluorine chemistries is low. Moreover, because aluminum nitride can be deposited at low temperatures, its use as an ARC extends to all levels of integration.

These and other features and advantages of the present invention will be more clearly understood from the following detailed description taken in conjunction with the accompanying drawings. It is important to point out that the illustrations are not necessarily be drawn to scale, and that there may be other embodiments of the present invention which are not specifically illustrated. Further, it is noted that like reference numerals are sometimes used to designate identical or corresponding parts throughout the several views.

FIGS. 1–5 illustrate, in cross-section, process steps in accordance with one embodiment of the invention, wherein an integrated circuit pattern is formed from a conductive layer on a portion of a semiconductor substrate (such as a wafer). Shown in FIG. 1 is a portion of a semiconductor device 10 (such as an integrated circuit). Device 10 includes a semiconductor substrate 12, a dielectric layer 16 overlying a major surface of semiconductor substrate 12, and a conductive layer 18 overlying dielectric layer 16. Semiconductor substrate 12 can be a single crystal silicon substrate, a silicon on insulator (SOI) substrate, a silicon on sapphire (SOS) substrate, a gallium arsenide substrate, or the like. Dielectric layer 16 can be thermally grown silicon dioxide, doped silicon dioxide, undoped silicon dioxide, oxynitride, silicon nitride, or the like, and may be formed using conventional deposition or oxidation techniques.

Conductive layer 18 in one form is aluminum, copper, or other metal, metal alloy, or metallic material used in a semiconductor devices. Conductive layer 18 may include underlying or overlying barrier and/or adhesion layers (not shown), such as titanium, titanium silicide, tungsten, tungsten silicide, and the like. In its metal form, conductive layer 18 will eventually be lithographically patterned to form metal interconnects within device 10. Accordingly, there is likely to be various intervening layers and structures between conductive layer 18, dielectric layer 16, and substrate 12. For instance, polysilicon layers for transistor gates, contacts, conductive plugs interlayer dielectrics, and the like. However, an understanding of any intervening elements is not important for purposes of practicing the present invention, thus these elements are not necessarily shown.

In another form, conductive layer 18 is formed of polysilicon or other conductive or semiconductive material used to form individual active devices, such as transistors or resistors, within device 10. In its polysilicon form, conductive layer 18 is likely to exist between substrate 12 and overlying metal interconnects layers, such as aluminum layers. If conductive layer 18 is polysilicon, dielectric layer 16 can be a gate oxide or gate dielectric layer, in which case layer 16 will be much thinner than if conductive layer were aluminum or other metal used for interconnect.

In light of the fact that layer 18 can be made of either a conductive material (e.g. a metal) or a semiconductive material (e.g. polysilicon), a clarification of terminology used herein will be helpful. As used henceforth for the sake of simplicity, "conductive" should be interpreted to mean materials used for transmitting electrical signals in semiconductor devices, including materials commonly referred to as "semiconductive" materials, as well as metals, metal alloys, and refractory metal silicides.

Conductive layer 18, whether at a metal level or a polysilicon level, must be patterned to define various lines, contacts, gates, etc. within device 10. In conventional patterning, a resist layer, such as a photoresist, is deposited on or over the conductive layer. A lithography mask having a corresponding pattern to the desired pattern of the conductive layer is then placed over the substrate. Radiation is transmitted through transparent portions of the mask and through resist layer portions underlying the transparent portions of the mask, thereby chemically altering portions of the resist layer. Ideally, only those portions of the resist layer directly beneath the transparent mask portions will be altered. However, some radiation which is transmitted through the resist layer will be reflected by the underlying conductive layer. The extent of reflection is dependent upon the absorptance, and transmittance of the conductive material at the wavelength used for exposure. The angle of reflection is quite dependent upon the surface roughness of the conductive layer and the surface topography. The reflected radiation reflects back into the resist layer, but often into regions other than those directly beneath the transparent portions of the mask. Accordingly, portions of the resist layer underlying opaque portions of the mask may also be chemically altered. Upon developing, the resist layer will have a pattern which does not exactly match the lithography mask pattern due to exposing portions of the resist layer to radiation which should have been protected by opaque portions of the mask. The inconsistency in the patterns is then replicated into the device through subsequent processing. In many instances, the replication of an inaccurate resist layer into a conductive layer results in notches in lines formed from the conductive layer. Accordingly, this problem is often referred to as "reflective notching."

Figure 2:
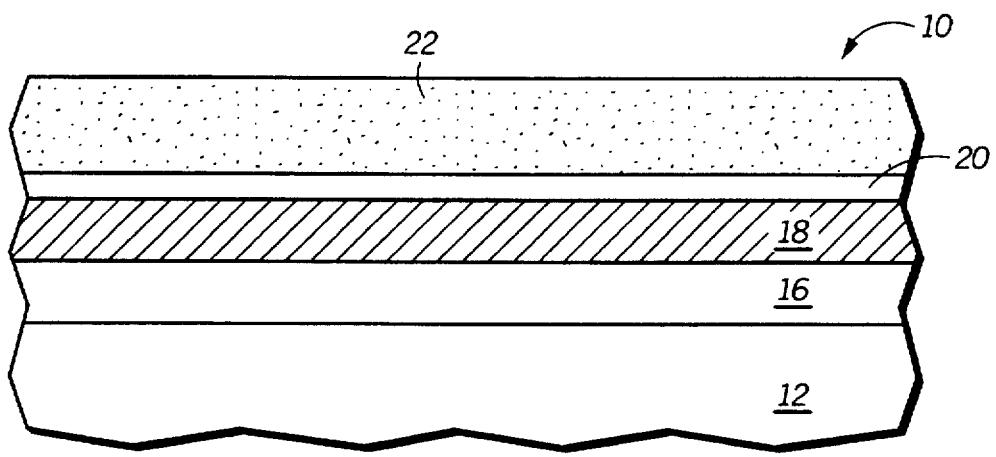

The present invention alleviates problems associated with unwanted reflectance of radiation during lithography operations with use of an anti-reflective coating (ARC) formed of aluminum nitride. As illustrated in FIG. 2, an ARC 20 is deposited on conductive layer 18, be it aluminum, polysilicon, silicide, or other reflective material. In accordance with the invention, ARC 20 is an aluminum nitride layer. In a preferred form, ARC 20 is deposited using reactive sputtering (RS) with an aluminum target in a pure nitrogen environment. Specific process parameters are likely to vary by reactor type and other variables, but can generally be defined as using a substrate temperature of 20° to 500° C., a nitrogen partial pressure of 1.0 to 8.0 mTorr, and a cathode power of 0.5 to 8.0 kWatt. More specifically, a process employing 4.0 mTorr nitrogen partial pressure, 300° C. substrate temperature and 3.0 kWatt power is preferred. Alternatively, ARC 20 can be deposited using chemical vapor deposition (CVD) or can be formed by thermally reacting exposed aluminum with nitrogen. Generally, ARC 20 also has a thickness which is greater than 50 Å (5 nanometers), for instance 100–400 Å (10–40 nanometers). In using ARC 20 on polysilicon, aluminum or other device level conductive material, preferably ARC 20 is deposited to a thickness of 200–400 Å (20–40 nm) depending primarily on the wavelength used for photolithographic exposure. Optimal thicknesses for ARC 20 (where optimal means having the minimum reflectivity) can also be approximated by the following equation:

$$t=(2m+1)\lambda/4n$$

wherein:

t=thickness of the anti-reflective layer

λ=exposure wavelength n=index of refraction for the anti-reflective layer at λ, m=0 or a positive integer such as 1, 2, 3, et cetera Further tailoring of the absorption of ARC 20 can be done by altering the composition, for instance by adding dopants or varying the nitrogen content of the film.

Figure 3:
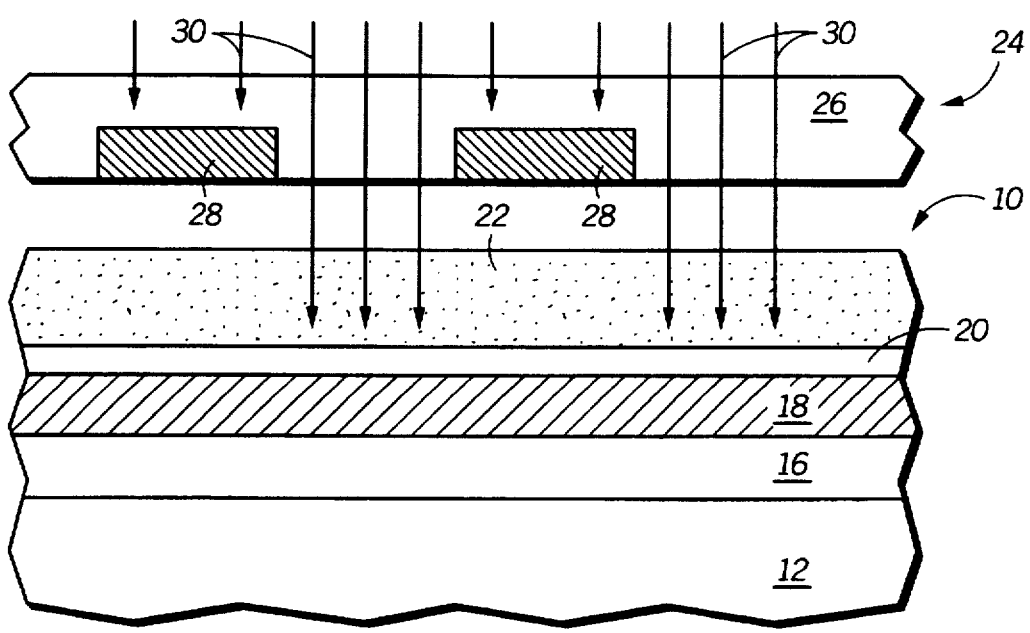

After depositing ARC 20, a resist layer 22 is formed overlying ARC 20, as also indicated in FIG. 2. The resist layer is preferably deposited using conventional spin-coating techniques employing any of several commercially available photoresists. After deposition, the resist layer is then patterned using conventional lithographic techniques. For example, as shown in FIG. 3, a lithography mask 24 (also known as a photo mask) is placed over device 10. Lithography mask 24 has a transparent portion 26 and opaque portions 28. The opaque portions are used to block radiation, so that radiation only passes through mask 24 in unobstructed transparent regions. For instance, radiation waves 30 as shown in FIG. 3 are blocked by opaque portions 28, but are elsewhere free to pass through transparent portion 26 to resist layer 22. In a preferred form of the invention, radiation waves 30 are ultraviolet radiation waves having wavelengths less than 300 nanometers. Particularly, the invention is suited for use with DUV, which currently is standardized to approximately 248 nanometers. Wavelengths under 300 nanometers are especially effective for use with the present invention because aluminum nitride, which is used to form ARC 20, is particularly absorptive as these shorter wavelengths. Thus, upon passing through resist layer 22, radiation waves 30 will be absorbed by ARC 20, rather than being transmitted through ARC 20 and reflected by conductive layer 18.

Figure 4:
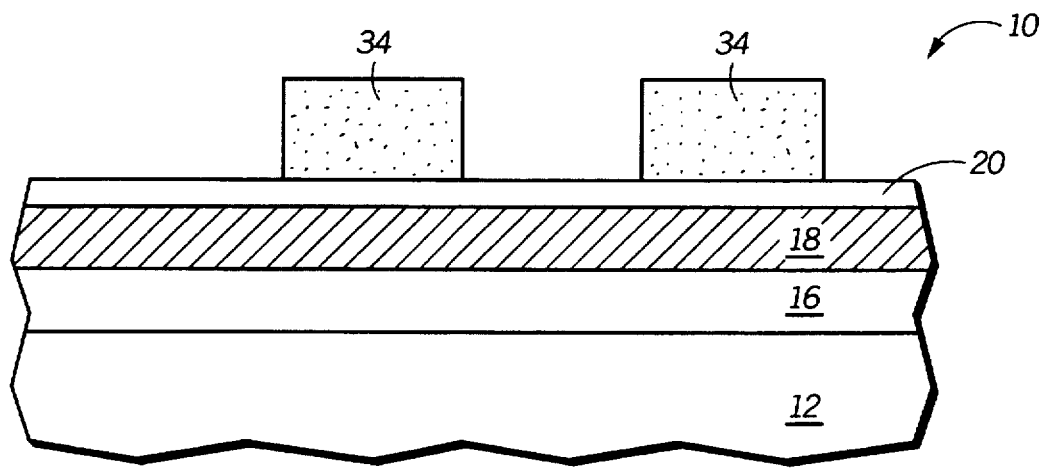

Upon exposing selected portions of resist layer 22 to radiation waves 30, these portions of the resist layer undergo chemical changes such as photo-acid generation which may either react with a host polymer via cross-linking reaction to form negative patterns or via deprotection reactions to form positive patterns. As a result, resist layer 22 can be developed in an alkaline solution to remove either the exposed portions of resist layer 22 (called positive imaging) or the unexposed portions of the resist layer 22 (called negative imaging). Both imaging techniques are well-known in the art, therefore further discussion is not necessary. An example of negative imaging is shown in FIG. 4, wherein portions of resist layer 22 exposed to radiation waves 30 in FIG. 3 remain intact after a developing operation. The remaining portions of resist layer 22 form a patterned resist mask 34. Once resist mask 34 is defined as a result of developing, device 10 is etched to transfer the resist mask pattern into underlying layers, specifically into ARC 20 and conductive layer 18. During the etch, resist mask 34 protects portions of the ARC 20 and conductive layer 18 directly underneath the mask from the etch. Thus, only portions of ARC 20 and conductive layer 18 existing beyond the confines of the resist mask will be etched.

In accordance with one embodiment of the present invention, particularly when conductive layer 18 is aluminum, one etch chemistry can be used to etch both ARC 20 and conductive layer 18 simultaneously. For example, a dry etch process using chlorine-based chemistry (e.g. $BCl_3+Cl_2$) will etch both aluminum and aluminum nitride. If conductive layer 18 is polysilicon, ARC 20 and polysilicon can be etched to form a stack, as illustrated, using a standard polysilicon etch (e.g. $Cl_2+HBr$). If for some reason it is desired, ARC 20 can also be removed selective to the underlying conductive member. For instance, an aluminum nitride layer can be removed selective to polysilicon with a hot phosphoric wet etch.

Figure 5:
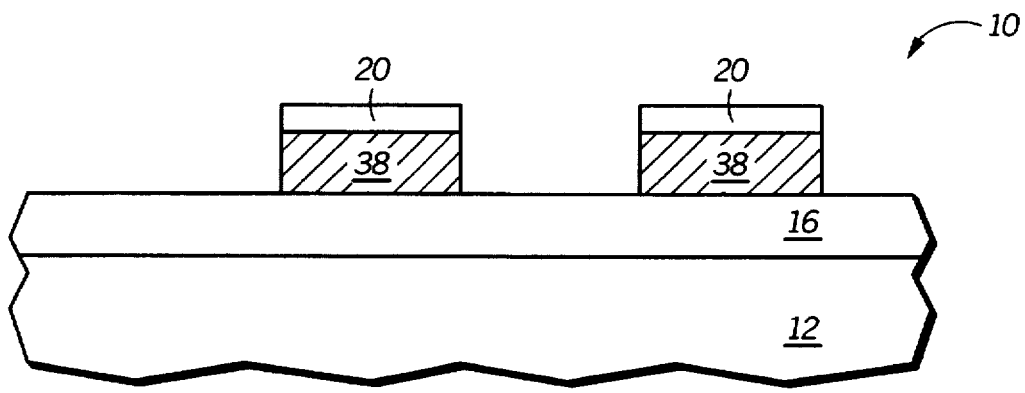

After etching unprotected portions of ARC 20 and conductive layer 18, resist mask 34 is removed. Remaining portions of conductive layer 18 form conductive members 38, each having an overlying ARC 20, as illustrated in FIG. 5. At this stage, several processing options are available. If conductive members 38 are formed of polysilicon, it may be desirable to remove ARC 20 so that the polysilicon conductive members can undergo a silicidation process. Alternatively, if silicide has been formed on the polysilicon prior to forming ARC 20, removal of the ARC will not necessarily be required. Because aluminum nitride is a dielectric material, ARC 20 must be removed at least from areas of conductive members 38 which are to be contacted. How electrical contact to conductive members 38 can be made is illustrated and described in reference to FIGS. 6–8.

Figure 6:
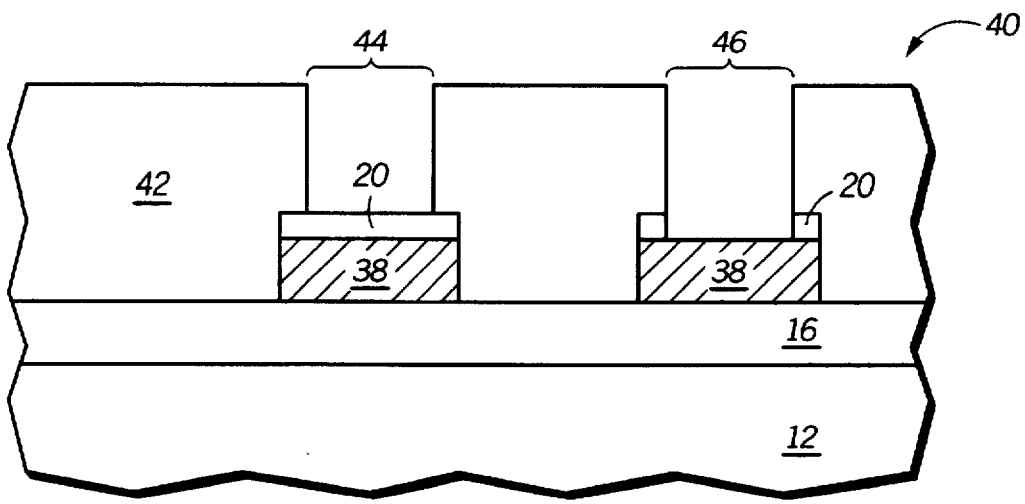
FIGS. 6–8 illustrate, in cross-section, a portion of a semiconductor device as contacts are formed to conductive members fabricated using an anti-reflective coating in accordance with the process illustrated in FIGS. 1–5.
Figure 7:
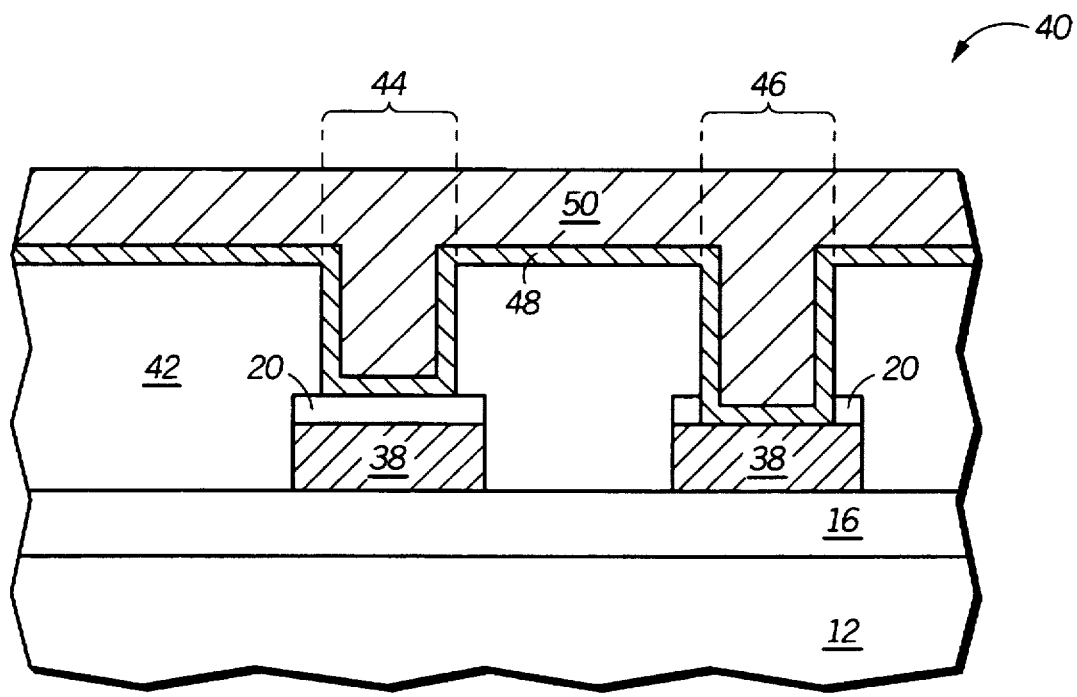
Figure 8:
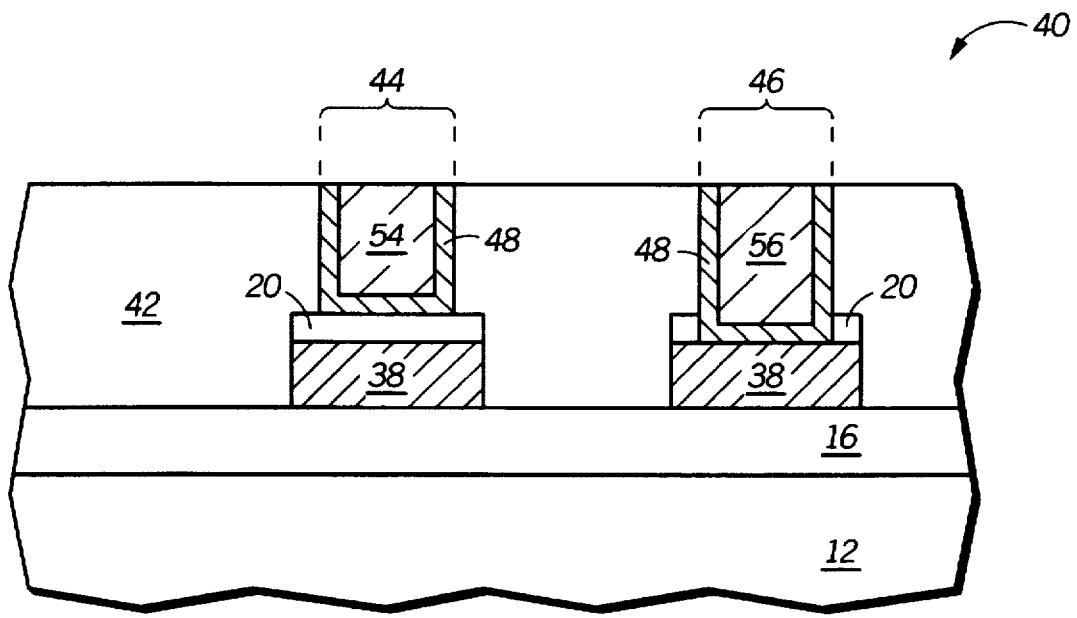

As illustrated in FIG. 6, a semiconductor device 40 undergoes processing steps, such as those illustrated and described in reference to FIGS. 1–5, to form conductive members 38, each having an overlying ARC 20. As illustrated in FIGS. 6–8, the conductive members are at a metal level of semiconductor device 40 (e.g. are formed of aluminum). How to form contacts to polysilicon level conductive members is subsequently described. An interlayer dielectric 42, preferably formed of tetra-ethyl-ortho silicate (TEOS), phospho-silicate-glass (PSG), or other oxide, is deposited over device 40. Openings overlying selected portions of the conductive members are then formed in the interlayer dielectric. As illustrated, two openings 44 and 46 are formed. Opening 44 exposes ARC 20, while opening 46 is etched through ARC 20 and exposes conductive member 38. The purpose of showing two different openings is to demonstrate the usefulness of ARC 20 as an etch stop and alternative ways of electrically contacting the conductive members. It is noted that the two different process sequences to form openings 44 and 46, and to subsequently form contacts therein, are unlikely to be used on the same device. Instead, one or the other process is likely to be used. However, both processes are shown in reference to device 40 for the purpose of illustration.

To form the openings, a resist mask is formed on device 40 in accordance with standard lithography procedures. Device 40 is then etched. To form opening 44, a fluorine-based dry etch chemistry is used because the etch will remove silicon oxides selective to aluminum nitride. Thus, ARC 20 becomes exposed in opening 44 as illustrated in FIG. 6. The etch selectivity between aluminum nitride and silicon oxides enables ARC 20 to serve as an etch stop layer in forming opening 44. This is particularly useful if openings of varying depths within device 40 are to be formed because any over-etch used to clear all openings will not adversely affect the conductive members to which contact is being made since ARC 20 is protecting the conductive members from etch exposure. To form opening 46, the same etch chemistry used to form opening 44 is first used, stopping on ARC 20 as well. Then, an etching step using pure $CF_4$, argon, nitrogen, or oxygen, or a mixture of these gases, can be used to etch away portions of ARC 20 exposed within opening 46, thereby exposing conductive member 38.

After forming the openings, one or more conductive materials are deposited onto device 40. As illustrated in FIG. 7, a glue layer 48 is deposited, followed by a tungsten layer 50. A typical glue layer for use with tungsten to ensure the tungsten adheres to interlayer dielectric 42 is a combination of titanium and titanium nitride. As a result of the metal depositions, glue layer 48 and tungsten layer 50 together fill openings 44 and 46. Because the metal deposition is a blanket process, a subsequent polish or etch-back process is necessary to establish individual conductive plugs 54 and 56, as illustrated in FIG. 8. Any available tungsten polishing or etch-back process can be used to form plugs 54 and 56. After forming the plugs, a metal interconnect layer (not shown) is deposited and etched to make appropriate contact to the plugs and provide signal routing in the device.

As illustrated in FIG. 8, plug 56 is in electrical contact with conductive member 38 since the ARC layer has been removed within opening 46. Plug 54, on the other hand, is in contact with ARC 20 within opening 44. Since ARC 20 is a dielectric, electrical connection between plug 54 and conductive member 38 is not yet established. However, electrical connection can be established by thermally reacting the aluminum nitride ARC with an adjacent titanium glue layer to form an aluminum-titanium-nitride composite which is conductive. For example, a 20 nanometer aluminum nitride RS deposited film onto which a 40–80 nanometer titanium layer has been deposited can be annealed for about 2 hours at 450° C. to form a conductive composite. Accordingly, one can form a contact without having to undergo a process for removing the ARC in the contact opening. One anticipated problem with converting the aluminum nitride to a conductive aluminum-titanium-nitride intermetallic is that contact resistance will be higher than is achieved using pure titanium in contact with aluminum, making use of the aluminum-titanium-nitride composite undesirable for certain applications. Nonetheless, these examples demonstrate a few of the many options available if an aluminum nitride ARC is used in accordance with the present invention.

To form a contact to a polysilicon conductive member having an aluminum nitride ARC there are also a few alternatives. As previously describe, after forming the polysilicon/ARC stack as represented in FIG. 5, the entire ARC layer can be removed selective to the polysilicon using, for example, a hot phosphoric acid etch. If the ARC is completely removed as this stage, there is no need to alter an existing process of forming contacts to the polysilicon. A interlayer dielectric, such as PSG or boron-doped PSG is deposited over the polysilicon members and contact openings are etched in the interlayer dielectric as usual. If the ARC is left on the polysilicon, processes similar to those described in reference to FIGS. 6–8 can be used, modifying the etch chemistries as necessary. For example, the interlayer dielectric can be etched selectively to the ARC layer, and then the ARC within the openings could be removed using a hot phosphoric acid etch to expose the polysilicon.

The foregoing description and illustrations contained herein demonstrate many of the advantages associated with the present invention. In particular, it has been revealed that aluminum nitride can be used as an anti-reflective coating over reflective materials used in semiconductor manufacturing, including aluminum, polysilicon, silicides, refractory metals and the like. Aluminum nitride is especially effective at exposure wavelengths under 300 nanometers, including 248 nanometer exposure wavelengths (commonly referred to as deep ultraviolet or DUV). Because all conductive layers are reflective at 248 nm, the present invention will benefit photolithographic patterning of all conductive materials using DUV. Furthermore, certain transparent film stacks also have enhanced reflectivity relative to the underlying substrate because of constructive interference, in which case the present invention can counter any undesired interference. Discovery of an effective ARC for DUV is important, as many existing ARCs are ineffective at shorter wavelengths or cannot be used at certain stages of device fabrication. Aluminum nitride deposition processes are compatible with both front-end and back-end semiconductor manufacturing. Moreover, use of an aluminum nitride ARC has an additional benefit of serving as an etch stop material for etching contact openings because aluminum nitride can be etched selectively to nearly all silicon-based oxides used in semiconductor manufacturing. Yet another advantage of using aluminum nitride over reflective, conductive layers is that in some applications it may be feasible to convert the aluminum nitride to a conductive aluminum-titanium-nitride intermetallic compound, thereby eliminating the need to remove the ARC to make contact to the underlying conductor.

Thus it is apparent that there has been provided, in accordance with the invention, a semiconductor device having an anti-reflective coating and method for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, an ARC used in accordance with the present invention need not be immediately adjacent the primary conductive layer. Intervening materials such as glue layers, silicides, barrier layers, and the like can exist. Furthermore, the ARC can be applied over a dielectric material, beneath which is formed a conductive or reflective member. Also, the invention is not limited to any particular type of aluminum nitride formation or deposition technique, as all techniques will provide an improved ARC for use with DUV (although the effectiveness of the ARC may vary slightly with deposition techniques and parameters). It is also important to note that the present invention is not limited in any way to use in conjunction with a particular reflective material. Aluminum and polysilicon are prevalently mentioned herein only because these are commonly used reflective materials in semiconductor fabrication. In addition, the invention is applicable with both positive and negative imaging lithography practices. Therefore, it is intended that this invention encompass all such variations and modifications as fall within the scope of the appended claims.

We claim:

1. A method for making a semiconductor device, comprising the steps of:

providing a semiconductor substrate;

depositing a conductive layer over the semiconductor substrate;

forming an anti-reflective coating comprised of aluminum nitride directly on the conductive layer;

depositing a resist over the anti-reflective coating;

exposing selected portions of the resist to ultraviolet radiation having a wavelength of less than 300 nanometers;

developing the resist to create a resist mask, the resist mask defining protected and unprotected regions of the anti-reflective coating and protected and unprotected regions of the conductive layer; and removing unprotected regions of the anti-reflective coating and unprotected regions of the conductive layer by etching.

2. The method of claim 1 wherein the step of forming an anti-reflective coating comprises reactively sputter depositing the anti-reflective coating using an aluminum target in an environment comprised of nitrogen.

3. The method of claim 1 wherein the step of depositing a conductive layer comprises depositing a conductive layer comprised of aluminum.

4. The method of claim 1 wherein the step of depositing a conductive layer comprises depositing a conductive layer comprised of polysilicon.

5. The method of claim 1 wherein the step of depositing an anti-reflective coating comprises depositing an anti-reflective coating having a thickness of between 10 to 40 nanometers.

6. The method of claim 1 further comprising the steps of:

removing the resist mask;

depositing an interlayer dielectric over remaining portions of the anti-reflective coating and conductive layer; and etching an opening in the interlayer dielectric, wherein the opening overlies a portion of the anti-reflective coating, wherein etching is performed until exposing the portion of the anti-reflective coating, and wherein the portion of the anti-reflective coating serves as an etch stop.

7. The method of claim 6 wherein the step of depositing a conductive layer comprises depositing a conductive layer comprised of aluminum, wherein the step of depositing an anti-reflective coating comprises depositing an anti-reflective coating having a thickness of between 10 to 40 nanometers, and further comprising the steps of:

depositing titanium on the portion of the anti-reflective coating exposed by the opening; and thermally reacting the titanium with the portion of the anti-reflective coating exposed by the opening to form a conductive intermetallic compound comprised of aluminum, nitrogen, and titanium.

8. The method of claim 1 further comprising the steps of:

removing the resist mask; and removing remaining portions of the anti-reflective coating selective to remaining portions of the conductive layer using an etch employing phosphoric acid.

9. The method of claim 1 wherein the step of exposing comprises exposing selected portions of the resist to deep ultraviolet radiation having a wavelength of 248 nanometers.

10. A method for making a semiconductor device, comprising the steps of:

providing a semiconductor wafer having a reflective layer, wherein the reflective layer reflects ultraviolet radiation and is conductive;

forming an anti-reflective layer directly on the reflective layer, wherein the anti-reflective layer comprises aluminum nitride;

depositing resist over the anti-reflective layer; and exposing selected portions of the resist to ultraviolet radiation having a wavelength 300 nm, wherein the ultraviolet radiation is transmitted through the selected portions of the resist and absorbed by the anti-reflective layer.

11. The method of claim 10 wherein the step of exposing comprises exposing selected portions of the resist to deep ultraviolet radiation having a wavelength of 248 nanometers.

12. The method of claim 10 wherein the step of providing a semiconductor wafer comprises providing a semiconductor wafer having a reflective layer comprised of aluminum.

13. The method of claim 10 wherein the step of providing a semiconductor wafer comprises providing a semiconductor wafer having a reflective layer comprised of polysilicon.

14. The method of claim 10 wherein the step of forming an anti-reflective layer comprises sputter depositing using an aluminum target in an environment containing nitrogen.

15. The method of claim 10 further comprising steps of:

developing the resist to create a resist mask;

using the resist mask to etch unmasked portions of the anti-reflective layer and the reflective layer;

removing the resist mask;

depositing an oxide over remaining portions of the anti-reflective layer and conductive layer; and etching an opening in the oxide, wherein the opening overlies a portion of the anti-reflective layer, wherein etching is performed until exposing the portion of the anti-reflective layer, and wherein the portion of the anti-reflective layer serves as an etch stop.

16. The method of claim 10 further comprising the steps of:

developing the resist to create a resist mask;

using the resist mask to etch unmasked portions of the anti-reflective layer and the reflective layer;

removing the resist mask; and removing remaining portions of the anti-reflective layer selective to remaining portions of the reflective layer using an etch employing phosphoric acid.

17. The method of claim 10 wherein the step of forming an anti-reflective layer comprises forming a doped anti-reflective layer.

* * * * *